(12) United States Patent
Kawai et al.

(10) Patent No.: US 12,201,995 B2
(45) Date of Patent: Jan. 21, 2025

(54) EQUIPMENT FRONT END MODULE

(71) Applicant: Sinfonia Technology Co., Ltd., Tokyo (JP)

(72) Inventors: Toshihiro Kawai, Tokyo (JP); Gengoro Ogura, Tokyo (JP)

(73) Assignee: Sinfonia Technology Co., Ltd., Tokyo (JP)

( * ) Notice: Subject to any disclaimer, the term of this patent is extended or adjusted under 35 U.S.C. 154(b) by 478 days.

(21) Appl. No.: 17/730,980

(22) Filed: Apr. 27, 2022

(65) Prior Publication Data

US 2022/0347694 A1 Nov. 3, 2022

(30) Foreign Application Priority Data

Apr. 28, 2021 (JP) .................................. 2021-076629

(51) Int. Cl.
| | |
|---|---|
| *B03C 3/017* | (2006.01) |
| *B03C 3/47* | (2006.01) |
| *B08B 6/00* | (2006.01) |
| *H01L 21/67* | (2006.01) |

(52) U.S. Cl.
CPC ............ *B03C 3/017* (2013.01); *B03C 3/0175* (2013.01); *B03C 3/47* (2013.01); *B08B 6/00* (2013.01); *H01L 21/67017* (2013.01); *H01L 21/67* (2013.01)

(58) Field of Classification Search
CPC .. B03C 3/017; B03C 3/47; B03C 3/34; B03C 3/0175; H01L 2/67
See application file for complete search history.

(56) References Cited

U.S. PATENT DOCUMENTS

| | | | |
|---|---|---|---|
| 2020/0219281 A1 | 7/2020 | Ogata et al. | |
| 2021/0013077 A1* | 1/2021 | Kawai | ............... H01L 21/67766 |

FOREIGN PATENT DOCUMENTS

| | | | | |
|---|---|---|---|---|
| JP | 2017005283 A | | 1/2017 | |
| JP | 2019016116 A | | 1/2019 | |
| JP | 2019161116 A | * | 9/2019 | ....... H01L 21/67017 |
| JP | 2019161117 A | * | 9/2019 | ............. H01L 21/02 |

* cited by examiner

*Primary Examiner* — Robert Clemente
(74) *Attorney, Agent, or Firm* — Kilpatrick Townsend & Stockton LLP

(57) ABSTRACT

An EFEM includes a circulation path including a transfer chamber configured to form a transfer space where a substrate is transferred and a return path configured to return a gas flowing from one side to the other side of the transfer chamber, the EFEM including: a capture part provided in the return path and configured to electrically capture particles contained in the gas flowing through the return path, wherein the return path and the transfer chamber are provided such that a partition wall is interposed therebetween, and a differential pressure is generated on both sides of the partition wall such that a pressure on the side of the return path becomes higher than a pressure on the side of the transfer chamber in a state in which the gas circulates through the circulation path.

18 Claims, 9 Drawing Sheets

EQUIPMENT FRONT END MODULE

CROSS-REFERENCE TO RELATED APPLICATION

This application is based upon and claims the benefit of priority from Japanese Patent Application No. 2021-076629, filed on Apr. 28, 2021, the entire contents of which are incorporated herein by reference.

TECHNICAL FIELD

The present disclosure relates to an EFEM (Equipment Front End Module) capable of circulating a gas.

BACKGROUND

A high degree of clean environment is required in a semiconductor manufacturing process and the like. In recent years, when forming a clean environment in a semiconductor manufacturing factory or the like, a mini-environment method is often adopted instead of a downflow method. The mini-environment method is a method that creates a local clean environment only around a substrate (e.g., wafer) which is a workpiece. The mini-environment method can create a clean environment which is less costly and more advanced than the downflow method that keeps the entire factory in a clean environment.

In the mini-environment method, wafers are stored, transferred, and preserved in a closed storage container called an FOUP (Front Opening Unified Pod), a cassette, a pod, etc., which is kept cleaner than the outside atmosphere. Then, the wafers stored in the storage container are delivered between the storage container and a processing apparatus via an EFEM connected to the processing apparatus without being exposed to the outside atmosphere.

Specifically, the EFEM is configured to include, for example, a housing that forms a substantially closed transfer chamber therein, a load port that functions as an interface part with a storage container, and the like. The load port is connected to one side of the housing and the processing apparatus is connected to the other side of the housing. A transfer device arranged in the transfer chamber loads and unloads wafers between the storage container connected to the load port and the processing apparatus.

By the way, in recent years, as the high integration of elements and the miniaturization of circuits proceed, there are increasing cases where the surroundings of a wafer are required to be kept in an atmosphere having a sufficiently low content of oxygen, water, etc., for example, an atmosphere of an inert gas, so that a change in surface texture such as oxidation or the like does not occur on the wafer.

In order to meet such requirements, an EFEM has been proposed in which an inert gas or the like is circulated inside a housing. For example, in the EFEMs described in Patent Documents 1 and 2, a fan filter unit provided above a transfer chamber forms a downflow of an inert gas in the transfer chamber. The inert gas reaching the lower side of the transfer chamber is introduced into a return path to flow upward therein and is sent back to the transfer chamber through the fan filter unit.

According to the EFEM having the configuration in which the inert gas is circulated as described above, the transfer chamber can be kept in the atmosphere of the inert gas while suppressing the consumption of the inert gas.

PRIOR ART DOCUMENTS

Patent Documents

Patent Document 1: Japanese Patent Application Publication No. 2019-16116
Patent Document 2: Japanese Patent Application Publication No. 2017-5283

In the EFEM that circulates a gas, while circulating a gas through a circulation path, a differential pressure may be generated on both sides of a partition wall that separates the return path and the transfer chamber such that a pressure on the side of the return path becomes higher than a pressure on the side of the transfer chamber.

For example, in the EFEM disclosed in Patent Document 1, a return path is provided in a hollow portion of a pillar of a housing. A fan is provided to send the gas flowing through the transfer chamber to the return path. By actively sending the gas to the return path by the fan, the gas is returned through the return path narrower than the transfer chamber. By providing such a fan, the pressure in the return path increases, and a differential pressure is generated on both sides of the partition wall separating the return path and the transfer chamber (i.e., the inside and outside of the pillar) such that a pressure on the side of the return path becomes higher than that on the side of the transfer chamber.

Further, for example, in the EFEM disclosed in Patent Document 2, the inside of a housing is divided into a transfer chamber and a return path by a partition wall. A supply pipe for supplying a gas to a circulation path is connected to an intermediate portion of the return path, and a gas is supplied from the intermediate position of the return path. By supplying the gas to the return path, the pressure in the return path increases, and the differential pressure is generated on both sides of the partition wall separating the return path and the transfer chamber such that the pressure on the side of the return path becomes higher than that on the side of the transfer chamber.

However, when such a differential pressure is generated, a slight gas leak may occur from the return path to the transfer chamber through a minute gap in the partition wall separating the return path and the transfer chamber. When such a gas leak occurs, particles contained in the gas flowing through the return path, i.e., particles that should normally be removed by the fan filter unit, may flow into the transfer chamber together with the gas and may adhere to a wafer in the transfer chamber.

SUMMARY

It is an object of the present disclosure to provide a technique capable of reducing particle contamination of a substrate in a gas circulation type EFEM.

The present disclosure has taken the following measures to achieve such an object.

That is, the present disclosure is directed to an EFEM including a circulation path including a transfer chamber configured to form a transfer space where a substrate is transferred and a return path configured to return a gas flowing from one side to the other side of the transfer chamber, the EFEM including a capture part provided in the return path and configured to electrically capture particles contained in the gas flowing through the return path, wherein the return path and the transfer chamber are provided such that a partition wall is interposed therebetween and a differential pressure is generated on both sides of the partition wall such that a pressure on the side of the return path becomes higher than that on the side of the transfer chamber in a state in which the gas circulates through the circulation path.

According to this configuration, the particles contained in the gas flowing through the return path are electrically captured. Therefore, even if the gas leaks from the return path toward the transfer chamber having a lower pressure than the pressure in the return path, the number of particles in the transfer chamber is unlikely to increase. Accordingly, it is possible to sufficiently suppress the adhesion of particles to the substrate in the transfer chamber. Further, when the particles contained in the gas flowing through the return path are to be captured by, for example, a gas permeation type filter, it is inevitable that a flow path resistance of the return path will increase significantly. Since the capture part provided in the return path electrically captures the particles, the particles can be captured without significantly increasing the flow path resistance of the return path.

In the EFEM, preferably, the capture part is configured to capture the particles contained in the gas by causing the particles to adhere to a charging surface by an electrostatic force.

According to this configuration, the particles contained in the gas flowing through the return path can be sufficiently captured with a simple configuration, and the maintenance is performed easily. For example, when capturing the particles with a filter, periodic filter replacement is required. However, if the particles are to be captured by causing the particles to adhere to the charging surface, the particles can be collected by a relatively simple operation such as releasing the charging of the charging surface and wiping the charging surface.

The EFEM preferably further includes a housing including a plurality of panels and a column configured to support the plurality of panels, wherein the column includes a hollow portion, wherein the return path is provided in the hollow portion, and wherein the capture part is provided on an inner wall surface of the column.

According to this configuration, the return path is provided in the hollow portion of the column. Therefore, footprint of the apparatus can be suppressed to a small size.

In the EFEM, preferably, the column includes an opening through which the capture part is accessible and a cover portion configured to be capable of closing and opening the opening.

According to this configuration, by keeping the opening in an open state, the capture part can be accessed through the opening. Accordingly, maintenance of the capture part can be performed easily.

In the EFEM, preferably, the circulation path includes an individual return path configured to return the gas flowing inside a predetermined device arranged in the transfer chamber, wherein the individual return path and the transfer chamber are provided such that a partition wall is interposed therebetween such that when the gas circulates through the circulation path, a differential pressure is generated on both sides of the partition wall such that a pressure on the side of the individual return path is kept higher than a pressure on the side of the transfer chamber, and wherein the capture part is provided in each of the return path and the individual return path.

According to this configuration, the gas flowing inside the devices arranged in the transfer chamber is returned through the individual return paths. Therefore, it is possible to sufficiently suppress occurrence of a situation in which the particles generated inside the devices are discharged to the transfer chamber and adhere to the substrate in the transfer chamber. Further, the particles contained in the gas flowing through the individual return path are electrically captured. Therefore, even if the gas leaks from the individual return path toward the transfer chamber having a lower pressure than the pressure in the individual return path, the number of particles in the transfer chamber is unlikely to increase.

In the EFEM, preferably, a connecting pipe configured to guide the gas flowing inside the predetermined device arranged in the transfer chamber is connected to an intermediate portion of the return path at an upstream side of the capture part.

According to this configuration, the gas flowing inside the devices arranged in the transfer chamber is returned through the return path. Therefore, it is possible to sufficiently suppress occurrence of a situation in which the particles generated inside the devices are discharged to the transfer chamber and adhere to the substrate in the transfer chamber. Further, since the gas flowing inside the devices is introduced into the return path at the upstream side of the capture part, particles contained in a mixed gas including the gas flowing through the transfer chamber and the gas flowing through the devices are captured by the capture part. Accordingly, the particles contained in both gases can be efficiently captured.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the present disclosure will be described with reference to the drawings.

<1. Overall Configuration of EFEM>

Figure 1:
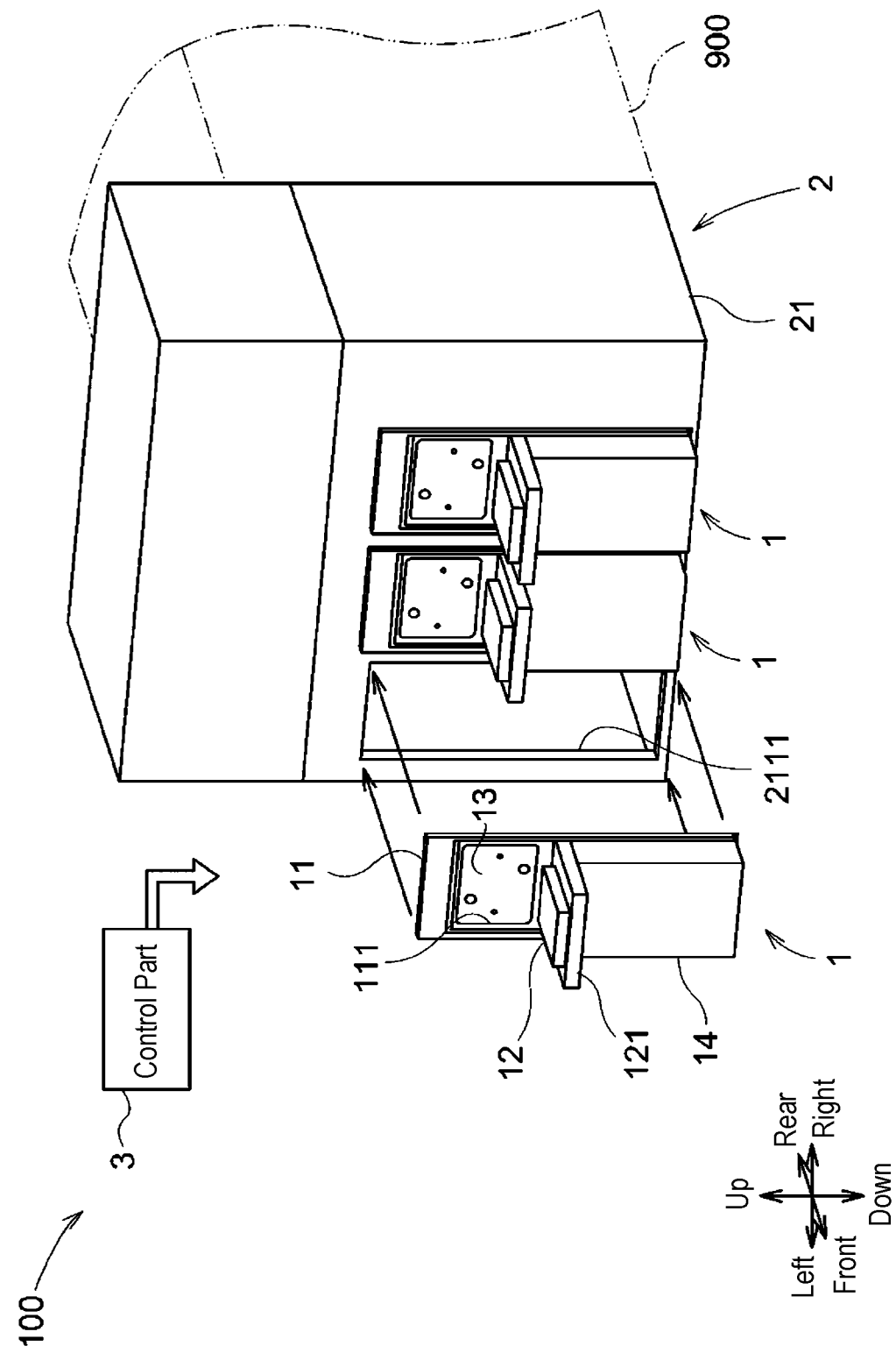
FIG. 1 is a perspective view schematically showing an appearance of an EFEM according to an embodiment of the present disclosure.
Figure 2:
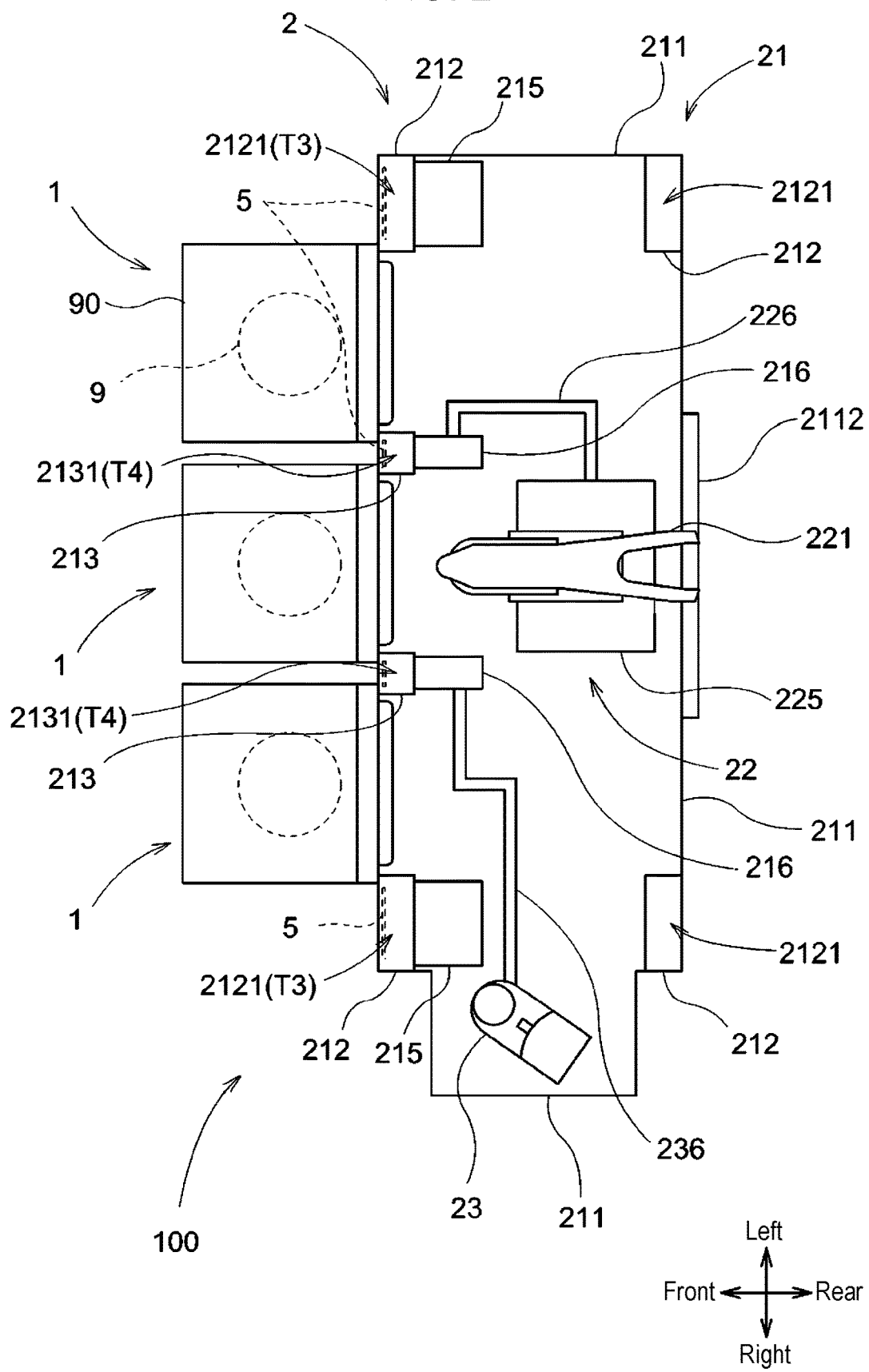
FIG. 2 is a plan view schematically showing the EFEM.
Figure 3:
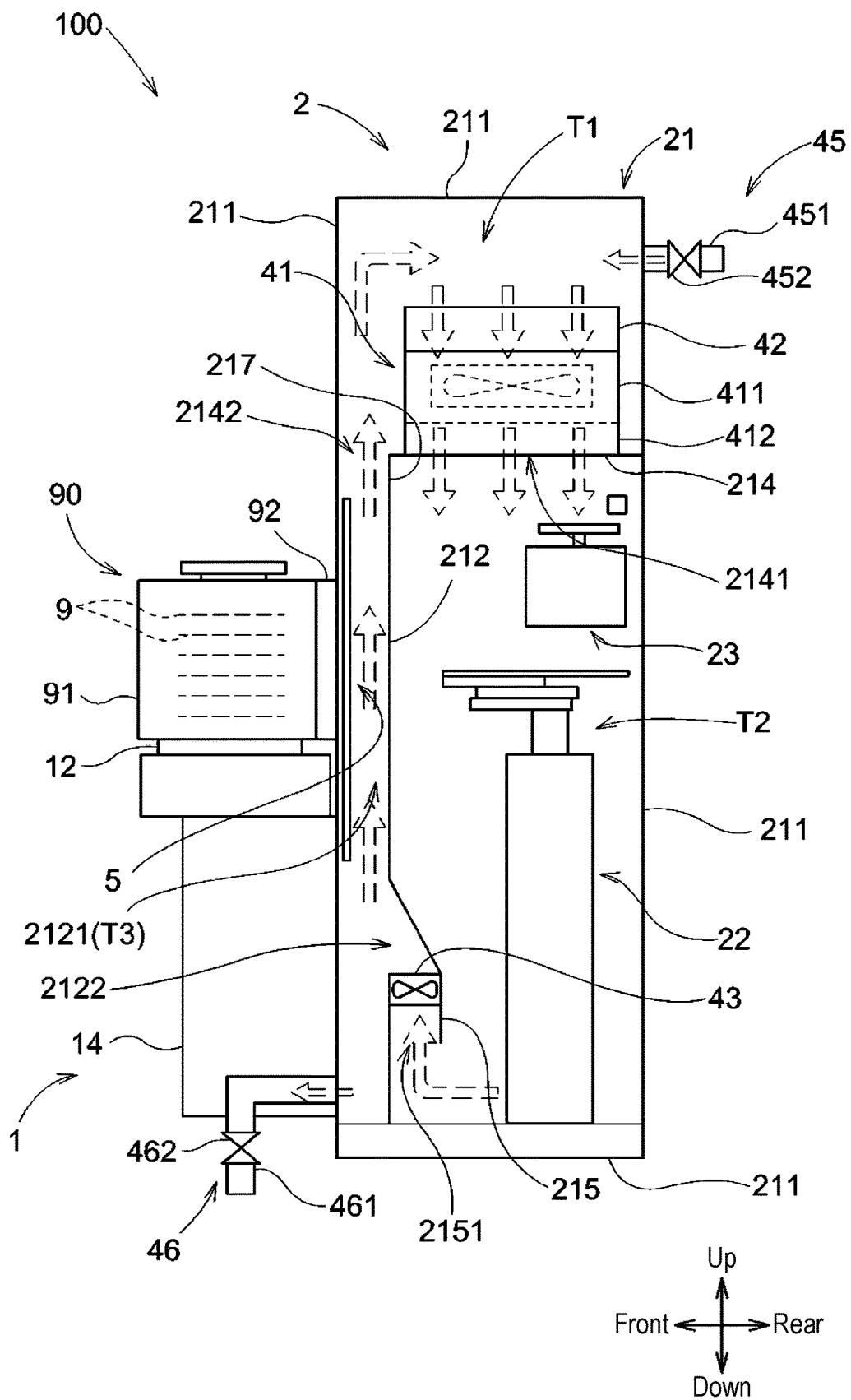
FIG. 3 is a side view schematically showing the EFEM, in which a side surface including a return path is shown.

The overall configuration of an EFEM (Equipment Front End Module) 100 according to an embodiment of the present disclosure will be described with reference to FIGS. 1 to 3. FIG. 1 is a perspective view schematically showing the appearance of the EFEM 100 according to the embodiment. FIG. 2 is a plan view schematically showing a main part of the EFEM 100. FIG. 3 is a side view schematically showing a main part of the EFEM 100.

The EFEM 100 is a module configured to deliver a wafer 9 between a processing apparatus 900 configured to perform various processes on the wafer 9 and a storage container 90 configured to accommodate the wafer 9. As shown in FIG. 1, the EFEM 100 is used by being connected to the processing apparatus 900 (typically, a load lock chamber of the processing apparatus 900). As shown in FIG. 3, the storage container (carrier) 90 is a closed type container including a main body portion 91 configured to accommodate wafers 9 in multiple stages in a horizontal posture, and a lid portion 92 configured to close an opening provided on one side wall of the main body portion 91. The storage container 90 is also called a FOUP (Front Opening Unified Pod), a cassette, or the like.

As shown in FIG. 1, the EFEM 100 includes a plurality of (three, in the example of the figure) load ports 1, a main body part 2, and a control part 3. The load ports 1 are arranged on one end side of the main body part 2. The processing apparatus 900 is connected to the other end side of the main body part 2 (i.e., the end portion on the side opposite to the side which the load ports 1 are connected). In the following, for the sake of convenience of explanation, the side of the main body part 2 to which the load ports 1 are connected will be referred to as "front", and the side of the main body part 2 to which the processing apparatus 900 is connected will be referred to as "rear." In addition, the horizontal direction orthogonal to the front-rear direction will be referred to as "left-right direction."

(Load Port 1)

The load port 1 is a module configured to connect the storage container 90 to the EFEM 100, and includes a base plate 11, a mounting part 12, a door part 13, and the like.

The base plate 11 is a flat plate-shaped member arranged in an upright posture. A support base 121 projecting in a horizontal posture is provided on one main surface of the base plate 11, and the mounting part 12 is provided on the support base 121. An upper surface of the mounting part 12 forms a mounting surface on which the storage container 90 is mounted. The mounting part 12 is provided with a mechanism (mounting part drive mechanism) configured to advance and retreat the mounting part 12 on the support base 121. By the driving of the mechanism, the mounting part 12 is moved between a proximity position in close proximity to the base plate 11 and a spaced-apart position spaced apart from the base plate 11. Further, the mounting part 12 is provided with a mechanism (gas replacement mechanism) configured to replace the atmosphere in the storage container 90 mounted on the mounting part 12 with a predetermined gas (nitrogen gas in the present embodiment).

Meanwhile, the base plate 11 has an opening 111 formed at a position where the opening 111 faces the lid portion 92 when the storage container 90 is mounted on the mounting part 12. The door part 13 is provided to close the opening 111. The door part 13 includes a mechanism (lid holding mechanism) configured to remove (unlatch) the lid portion 92 arranged opposite to the door part 13 from the main body portion 91 and connect and integrate (dock) the lid portion 92 to the door part 13. Further, the door part 13 is provided with a mechanism (door part driving mechanism) configured to move the door part 13. By the driving of the door part driving mechanism, the door part 13 is moved between a closing position where the door part 13 closes the opening 111 and an opening position where the door part 13 retreats to a position below the opening 111 to open the opening 111.

The mounting part 12, the door part 13, and the case 14 in which various drive mechanisms are stored, are supported by the base plate 11. The base plate 11 that supports the mounting part 12, the door part 13 and the case 14 is attached to close an opening 2111 formed in the front wall of the housing 21 of the main body part 2.

The operation of the load port 1 is as follows. First, the storage container 90 containing unprocessed wafers 9 is transferred by an external robot such as an OHT, an AMHS, a PGV, etc., such that the lid portion 92 is mounted on the upper surface of the mounting part 12 in such an orientation as to face the door part 13. At this time, the mounting part 12 is arranged at the spaced-apart position. After the storage container 90 is mounted on the mounting part 12, the mounting part drive mechanism moves the mounting part 12 from the spaced-apart position to the proximity position. As a result, the lid portion 92 of the storage container 90 mounted on the mounting part 12 is arranged to face the door part 13 while being close to the door part 13.

In such a state, the lid holding mechanism provided in the door part 13 removes the lid portion 92 of the storage container 90 from the main body portion 91 and connects and integrates the lid portion 92 to the door part 13. Subsequently, the door part drive mechanism moves the door part 13 from the closing position to the opening position, together with the lid portion 92 integrated with the door part 13. As a result, the inside of the storage container 90 communicates with the inside of the main body part 2 through the opening 111, and the unprocessed wafer 9 stored in the storage container 90 is taken out by a transfer mechanism 22 (described later) arranged inside the main body part 2.

(Main Body Part 2)

The main body part 2 includes a housing 21 which is a rectangular parallelepiped frame provided between the plurality of load ports 1 and the processing apparatus 900. As shown in FIGS. 2 and 3, the housing 21 includes a plurality of panels 211, a plurality of corner columns 212, a plurality of intermediate columns 213, a support plate 214, and the like.

The panel 211 is a substantially rectangular flat plate-shaped member that forms a peripheral wall surface of the housing 21. In this example, six panels 211 are combined in a rectangular parallelepiped shape. That is, four of the six panels 211 are arranged in a vertical posture to form a front wall, a rear wall, a left wall and a right wall of the housing 21. Further, the remaining two panels 211 are arranged in a horizontal posture to form a ceiling and a bottom plate of the housing 21. These six panels 211 are precisely attached so as not to create a gap through which the internal gas may flows out. The space surrounded by the six panels 211 is a substantially airtight closed space. Needless to say, a sealing member or the like may be provided between the adjacent panels 211 to improve airtightness of an internal space.

The panel 211 constituting the front wall of the housing 21 is provided with a plurality of openings 2111. The load port 1 (specifically, the base plate 11) is attached to airtightly close each opening 2111 (see FIG. 1). On the other hand, for example, a load lock chamber of the processing apparatus 900 is connected to the panel 211 constituting the rear wall of the housing 21. The panel 211 constituting the rear wall is formed with an opening configured to communicate the housing 21 and the load lock chamber. The opening is configured to be hermetically closed by a gate valve 2112 or the like.

The corner columns 212 are rod-shaped members configured to support the panels 211 and are respectively provided at the four corners of the housing 21. That is, the corner columns 212 are provided at the left front corner, the right front corner, the left rear corner, and the right rear corner of the housing 21, respectively. Each corner column 212 has a tubular shape and has a hollow portion 2121 formed therein.

In order to avoid interference with the transfer device 22 and the like, which will be described later, a front-rear width of each corner column 212 is preferably set to 100 mm or less. Meanwhile, as will be described later, the hollow portion 2121 of the corner column 212 constitutes a return path T3. In order to reduce a flow path resistance of the hollow portion 2121, it is preferable to increase a left-right width of each corner column 212 as much as possible. However, as the left-right width increases, footprint of the apparatus increases. In consideration of balance thereof, the left-right width of each corner column 212 is set to, for example, about 200 mm.

The intermediate columns 213 are rod-shaped members configured to support the panel 211 constituting the front wall and are provided between the adjacent openings 2111 of the panel 211. In this example, three openings 2111 are provided to correspond to the three load ports 1. The intermediate columns 213 are respectively provided between the right opening 2111 and the middle opening 2111, and between the middle opening 2111 and the left opening 2111. Like the corner columns 212, each intermediate column 213 has a tubular shape and has a hollow portion 2131 formed therein.

In order to avoid interference with the transfer device 22 and the like, it is preferable that the front-rear width of each intermediate column 213 is also set to 100 mm or less. Meanwhile, as will be described later, the hollow portion 2131 of the intermediate column 213 constitutes an individual return path T4. In order to reduce the flow path resistance of the hollow portion 2131, it is preferable that the left-right width of each intermediate column 213 should be as large as possible. However, as the left-right width increases, a distance between adjacent load ports 1 becomes wider. In consideration of the balance thereof, the left-right width of each intermediate column 213 is set to, for example, about 80 mm.

The support plate 214 is a substantially rectangular flat plate-shaped member configured to vertically divide the space surrounded by the six panels 211 and is provided in a horizontal posture in the vicinity of the panels 211 constituting the ceiling. Among the spaces surrounded by the six panels 211, a space above the support plate 214 is hereinafter referred to as "unit installation chamber T1." A fan filter unit 41 or the like is arranged in the unit installation chamber T1. Further, among the spaces surrounded by the six panels 211, the space below the support plate 214 is hereinafter referred to as "transfer chamber T2." The transfer chamber T2 forms a space (transfer space) in which the wafer 9 is transferred between the storage container 90 mounted on the load port 1 and the processing apparatus 900.

A transfer device 22, an aligner 23, and the like are arranged in the transfer chamber T2. The transfer device 22 is arranged substantially at the center of the transfer chamber T2. On the other hand, the aligner 23 is arranged on the right side of the transfer device 22. In this example, the panel 211 constituting the right wall of the housing 21 has a U-shaped cross section including a portion rising in the left-right direction from the front end side and the rear end side, whereby a space that overhangs to the right of the right corner column 212 is formed inside the transfer chamber T2. The aligner 23 is arranged in the overhanging space.

Figure 4:
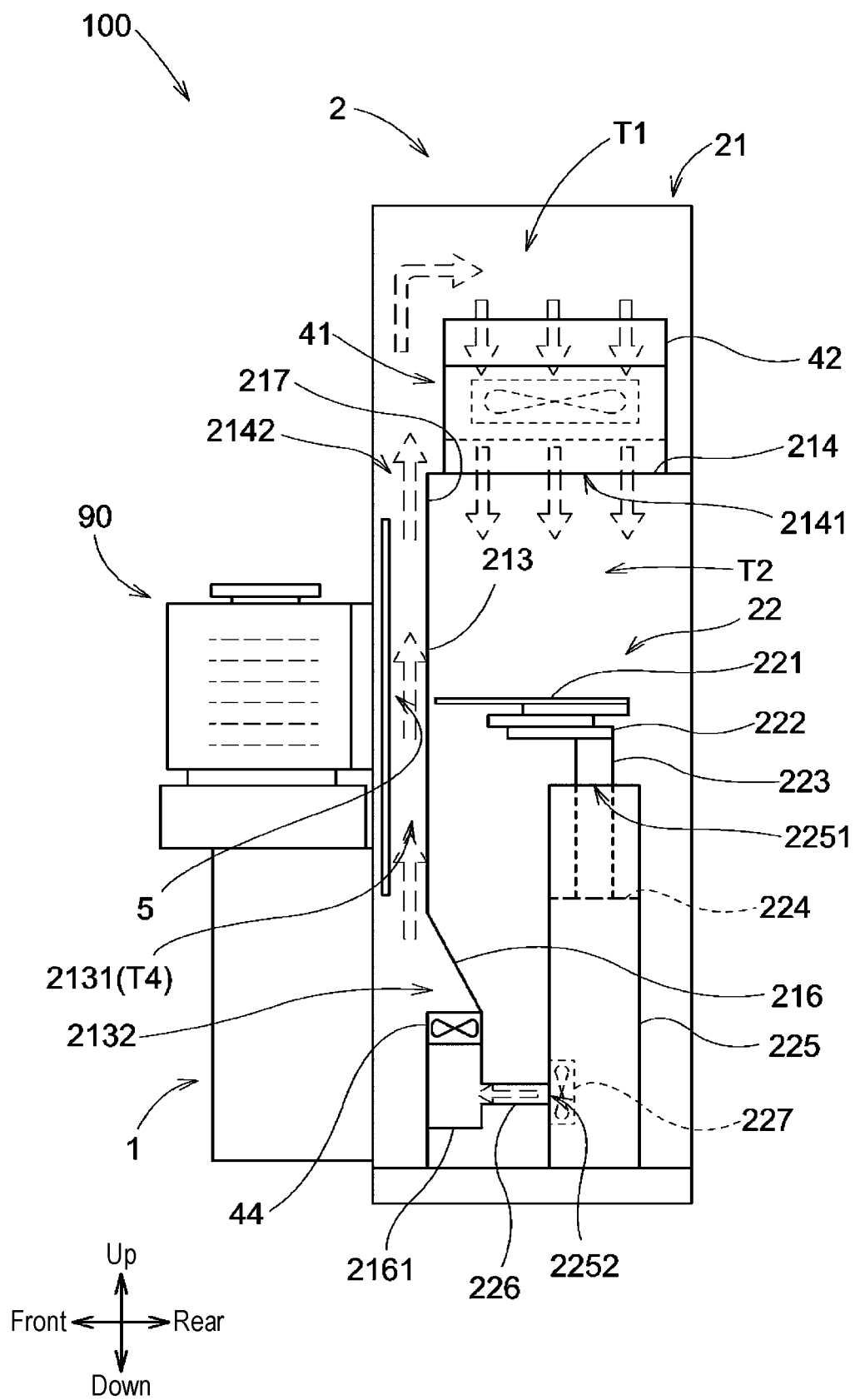
FIG. 4 is a side view schematically showing the EFEM, in which a side surface including an individual return path connected to a transfer device is shown.

The transfer device 22 will be described with reference to FIG. 4. FIG. 4 is a side view schematically showing a main part of the EFEM 100, in which the transfer device 22 and the side surface including the individual return path T4 (described later) connected to the transfer device 22 are shown.

The transfer device 22 is a device configured to transfer the wafer 9 between the FOUP 90 mounted on the load port 1 and the processing apparatus 900 and is configured to include a hand 221, an arm 222, an elevating column 223, a drive mechanism 224, a case 225, and the like.

The hand 221 is a member that grips the wafer 9 by an appropriate method such as a mechanical clamp method, a vacuum chuck method, an electrostatic chuck method, or the like, and is connected to the tip of the arm 222. The number of hands 221 connected to the tip of the arm 222 may be one or two or more. The arm 222 has, for example, an articulated structure, and is driven by a drive mechanism 224 to freely rotate in a horizontal plane. The elevating column 223 is a rod-shaped member connected to the arm 222 and is moved up and down by being driven by the drive mechanism 224. The drive mechanism 224 is a mechanism configured to drive the arm 222, the elevating column 223, and the like, and includes a motor, a ball screw mechanism, and the like.

The case 225 is fixed in the transfer chamber T2. The drive mechanism 224 is accommodated inside the case 225. An opening 2251 is provided on the upper surface of the case 225. The elevating column 223 is inserted through the opening 2251. The elevating column 223 is connected to the drive mechanism 224 at the lower end arranged inside the case 225 and is connected to the arm 222 at the upper end protruding upward from the case 225. An inner diameter of the opening 2251 is slightly larger than an outer diameter of the elevating column 223 so as not to hinder the raising and lowering of the elevating column 223. A slight gap is formed between the opening 2251 and elevating column 223.

A through-hole 2252 is provided in the side wall of the case 225. The through-hole 2252 and the closing duct 216, which will be described later, are connected to each other via a connecting pipe 226. The case 225 is provided with a fan 227 configured to send the gas in the case 225 to the connecting pipe 226 via the through-hole 2252. By driving the fan 227, the gas in the case 225 is discharged to the connecting pipe 226 together with the particles generated therein.

The transfer device 22 executes a predetermined transfer operation under the control of the control part 3. That is, by performing operations such as the raising and lowering of the elevating column 223, the rotating of the arm 222, the gripping and releasing of the wafer 9 on the hand 221, and the like in combination, the transfer device 22 takes out the unprocessed wafer 9 from the FOUP 90 mounted on the load port 1 and loads the unprocessed wafer 9 into the processing apparatus 900. Further, the transfer device 22 unloads the processed wafer 9 from the processing apparatus 900 and stores the processed wafer 9 in the FOUP 90 mounted on the load port 1.

Figure 5:
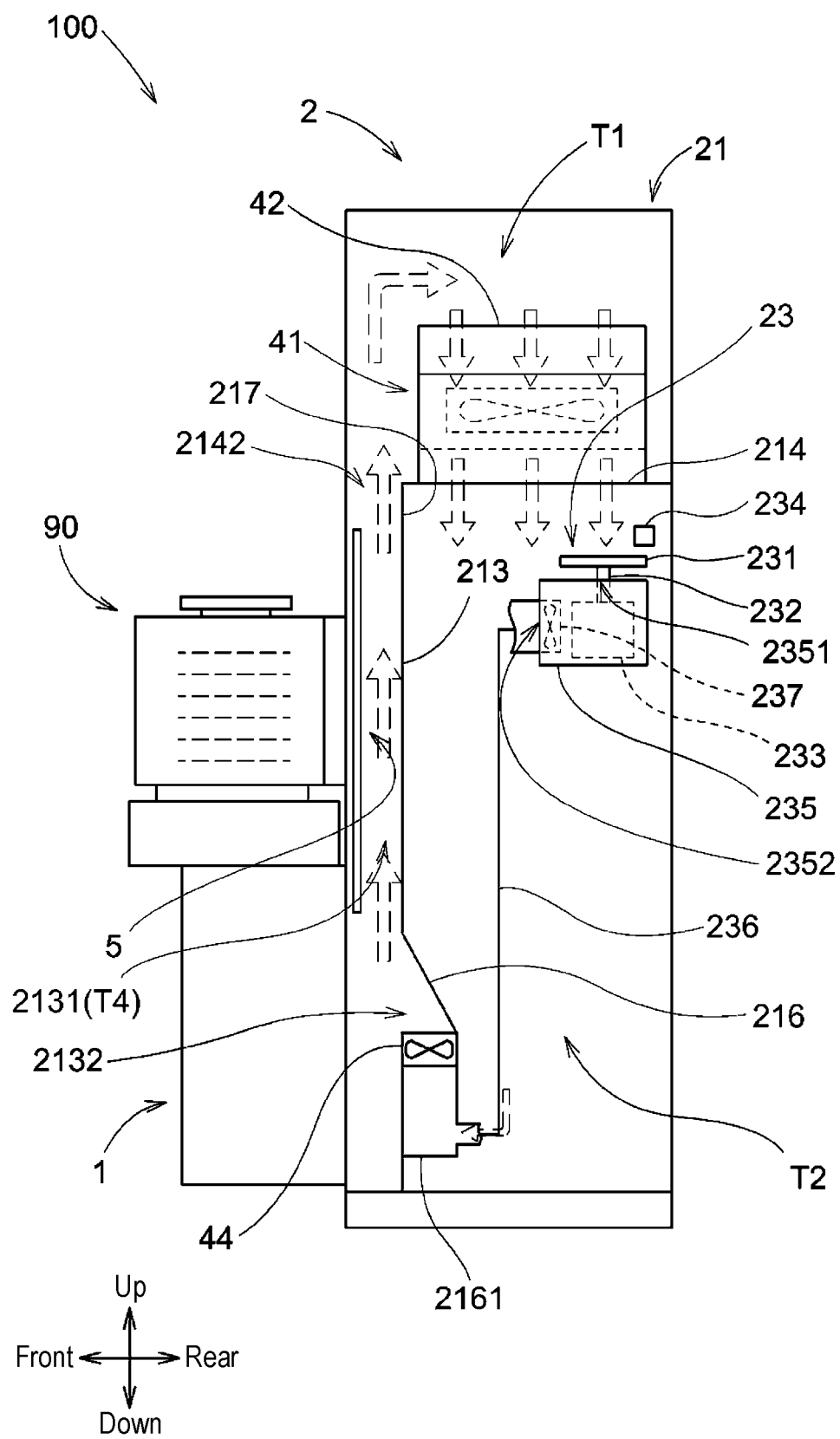
FIG. 5 is a side view schematically showing the EFEM, in which a side surface including an individual return path connected to an aligner is shown.

The aligner 23 will be described with reference to FIG. 5. FIG. 5 is a side view schematically showing a main part of the EFEM 100, in which the aligner 23 and the side surface including the individual return path T4 (described later) connected to the aligner 23 are shown.

The wafer 9 stored in the storage container 90 may undergo a slight position shift while the storage container 90 is conveyed by an external robot and mounted on the mounting part 12 of the load port 1. The aligner 23 is a device that detects the position shift and performs position correction (alignment) to correct the position shift. The aligner 23 includes a table 231, a rotary column 232, a drive mechanism 233, a detection part 234, a case 235, and the like.

The table 231 is a member on which the wafer 9 to be aligned is placed. The rotary column 232 is a rod-shaped member connected to the center position of the lower surface of the table 231 and is rotated about the central axis under the driving of the drive mechanism 233. The drive mechanism 233 is a mechanism configured to drive the rotary column 232 and the like, and includes a motor, a pulley, and the like. The detection part 234 detects how much the wafer 9 is shifted from the desired position, based on a peripheral edge position and the like of the wafer 9 placed on the rotating table 231.

The case 235 is supported by a support base (not shown) provided in the transfer chamber T2. The drive mechanism 233 is accommodated inside the case 235. An opening 2351 is provided on the upper surface of the case 235. The rotary column 232 is inserted through the opening 2351. The rotary column 232 is connected to the drive mechanism 233 at the lower end arranged inside the case 235 and is connected to the table 231 at the upper end protruding upward from the case 235. An inner diameter of the opening 2351 is slightly larger than an outer diameter of the rotary column 232 so as not to hinder the rotation of the rotary column 232. A slight gap is formed between the opening 2351 and the rotary column 232.

A through-hole 2352 is provided in the side wall of the case 235. The through-hole 2352 and the closing duct 216, which will be described later, are connected to each other via a connecting pipe 236. The case 235 is provided with a fan 237 configured to send the gas in the case 235 to the connecting pipe 236 via the through-hole 2352. By driving the fan 237, the gas in the case 235 is discharged to the connecting pipe 236 together with the particles generated therein.

The aligner 23 executes a predetermined alignment operation under the control of the control part 3. That is, when the transfer device 22 places the wafer 9 taken out from the storage container 90 on the table 231 of the aligner 23, the aligner 23 detects the peripheral edge position of the wafer 9 placed on the table 231 using the detection part 234 while rotating the table 231 and specifies how much the wafer 9 is shifted from the desired position. The specified position shift amount is notified to the control part 3. The control part 3 corrects the receiving position of the hand 221 when the transfer device 22 unloads the wafer 9 placed on the table 231, based on the position shift amount. As a result, a positional relationship between the wafer 9 and the hand 221 becomes a desired one. That is, the wafer 9 is unloaded from the aligner 23 in a state in which the wafer 9 is appropriately aligned by being subjected to position shift correction. The wafer 9 is loaded into the processing apparatus 900.

(Control Part 3)

Referring again to FIG. 1, the control part 3 controls operations of the respective parts included in the EFEM 100. Specifically, the control part 3 performs various controls related to the operation of the load port 1, various controls related to the operation of the transfer device 22, various controls related to the operation of the aligner 23, various controls related to nitrogen circulation (described later) in the housing 21, and the like.

Hardware configuration of the control part 3 is the same as that of a general computer. That is, the control part 3 includes a CPU that performs various arithmetic processes, a ROM as a read-only memory that stores required programs, a RAM as a read/write memory that stores various kinds of information, a magnetic disk that stores control software, data, etc., various interfaces, and so on. When the CPU of the control part 3 executes the program stored in the memory, a predetermined operation is performed in the EFEM 100.

<2. Circulation Path>

Figure 6:
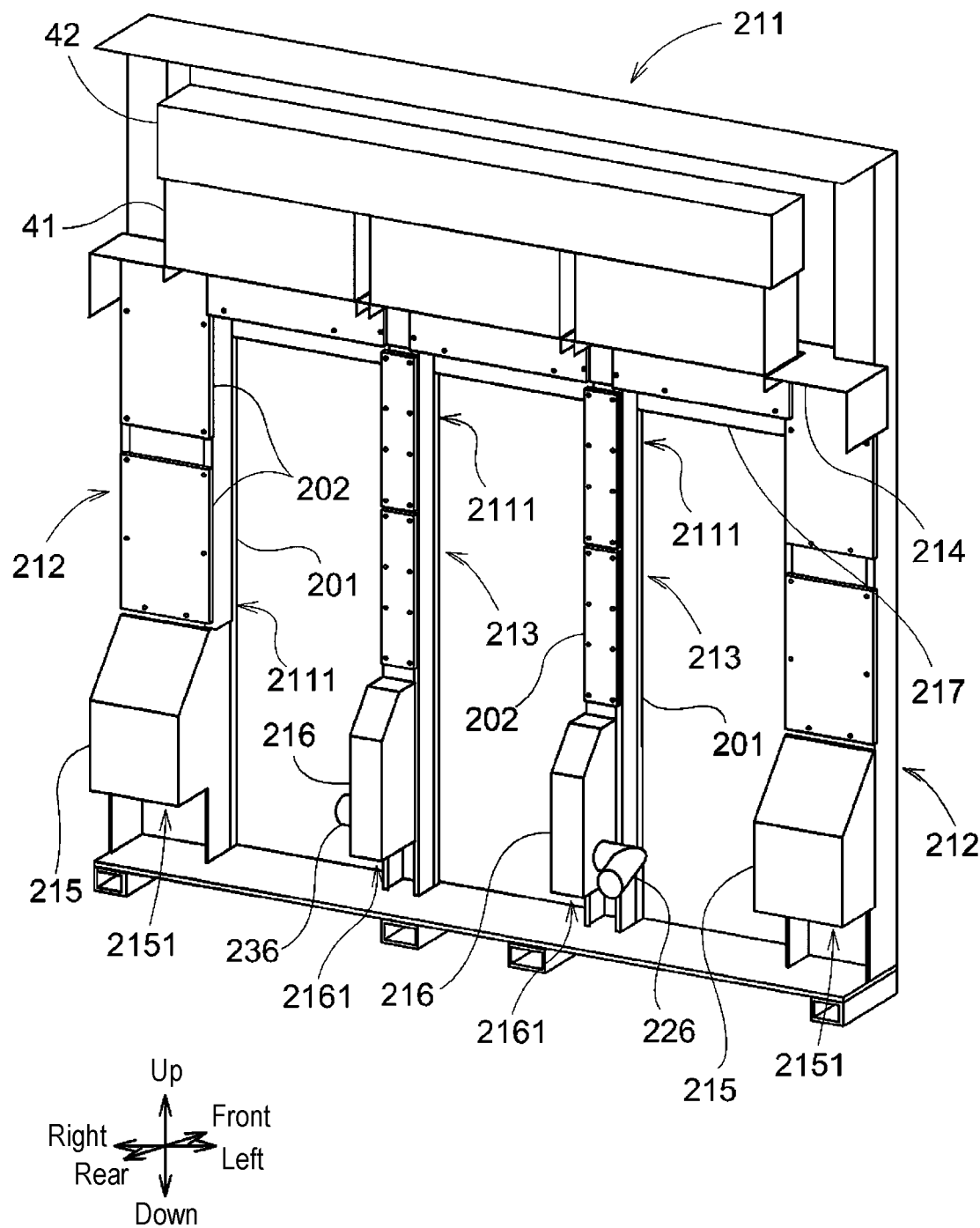
FIG. 6 is a rear view of a panel constituting a front wall of a housing.
Figure 7:
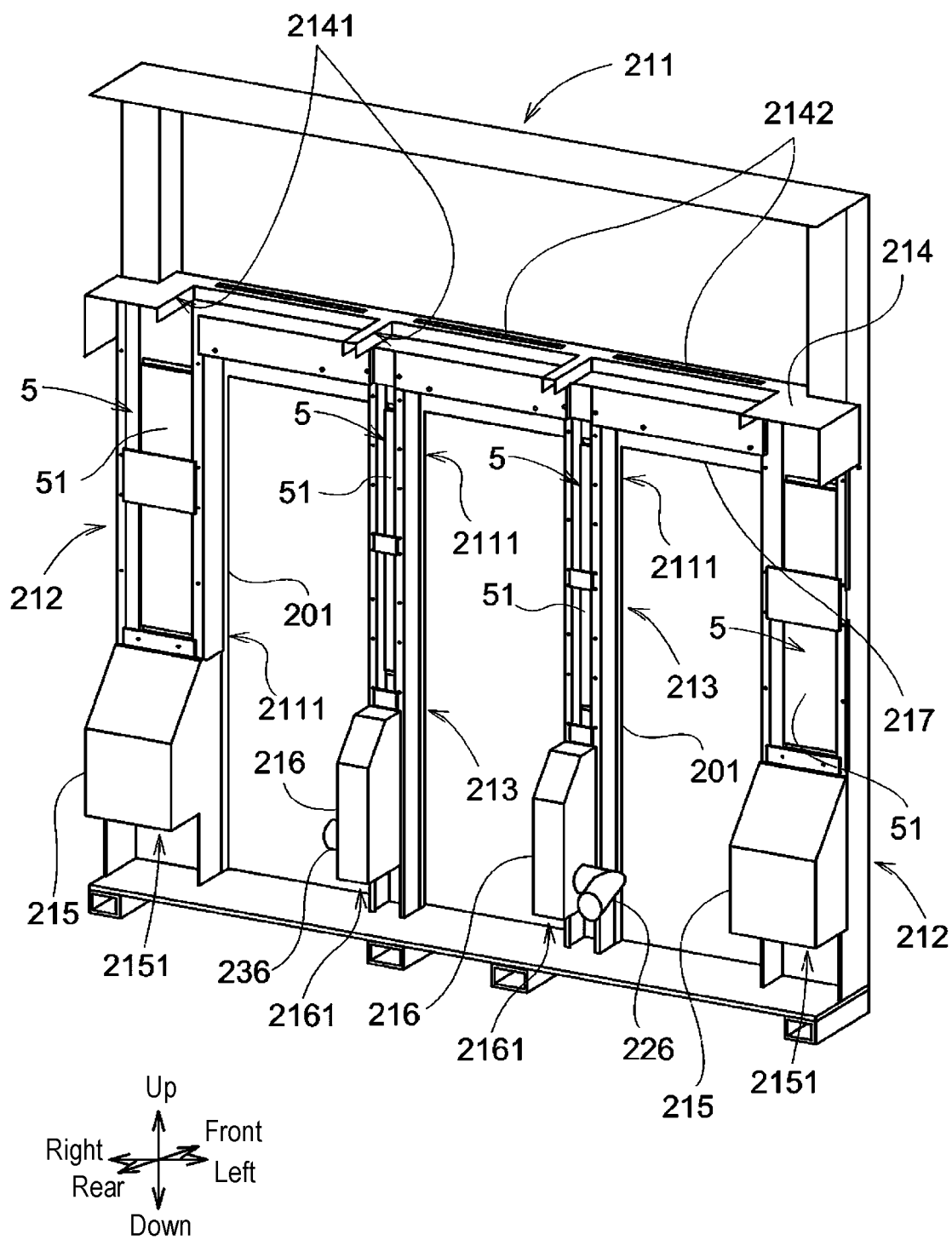
FIG. 7 is a view showing a state in which a fan filter unit, a chemical filter and a cover portion are removed from FIG. 6.

When the EFEM 100 is in an operating state, an internal space of the housing 21 is filled with a predetermined gas (nitrogen gas in the present embodiment) and is configured such that the predetermined gas circulates in the internal space. A circulation path through which the gas circulates will be described with reference to FIGS. 6 and 7 in addition to FIGS. 2 to 5. FIG. 6 is a rear view of the panel 211 constituting the front wall of the housing 21. FIG. 7 is a view showing a state in which the fan filter unit 41, the chemical filter 42 and the cover portion 202 are removed from FIG. 6.

As shown in FIGS. 3 to 5, the circulation path includes a unit installation chamber T1 in which a fan filter unit 41 or the like is arranged, a transfer chamber T2 forming a transfer space, a return path T3 (see FIG. 3) configured to return the nitrogen gas flowing from one side to the other side of the transfer chamber T2, and individual return paths T4 (see FIGS. 4 and 5) configured to return the gas flowing inside the transfer device 22 and the aligner 23 arranged in the transfer chamber T2.

(Unit Installation Chamber T1 & Transfer chamber T2)

As described above, the unit installation chamber T1 is a space above the support plate 214 in the space surrounded by the six panels 211. Further, the transfer chamber T2 is a space below the support plate 214 in the space surrounded by the six panels 211. That is, the unit installation chamber T1 and the transfer chamber T2 are separated by the support plate 214. The support plate 214 is provided with an opening 2141 (see FIG. 7). The unit installation chamber T1 and the transfer chamber T2 communicate with each other through the opening 2141.

A fan filter unit 41 and a chemical filter 42 are provided in the unit installation chamber T1.

The fan filter unit (FFU) 41 is a unit configured to form a laminar flow flowing downward in the transfer chamber T2 and is accommodated in the unit installation chamber T1 by being supported by the support plate 214. As shown in FIG. 3 and the like, the fan filter unit 41 includes a fan 411 and a filter 412. The fan 411 sucks a gas from above and sends the gas downward. The filter 412 is configured by, for example, a ULPA filter. The filter 412 captures and removes particles contained in the gas sent by the fan 411.

When the fan 411 of the fan filter unit 41 is operated, the nitrogen gas in the unit installation chamber T1 is sent to the transfer chamber T2 through the opening 2141 provided in the support plate 214 while being cleaned by the filter 412. As a result, a laminar flow (downflow) flowing downward in the transfer chamber T2 is formed.

The chemical filter 42 is a filter configured to remove an active gas, molecular pollutants, and the like, and is arranged on the upstream side of the fan filter unit 41 in the unit installation chamber T1. Therefore, the nitrogen gas flowing into the unit installation chamber T1 will flow into the fan filter unit 41 after the active gas, the molecular contaminants, and the like are removed when passing through the chemical filter 42.

(Return Path T3)

The return path T3 is provided in each of the hollow portions 2121 of the two corner columns arranged on the front side (i.e., the corner columns arranged at the left front corner and the right front corner, respectively, which will be hereinafter also referred to as "front corner columns") 212.

As shown in FIG. 3, an opening 2122 communicating with the hollow portion 2121 is formed at a position near the lower end on the rear surface of each front corner column 212, and an opening duct 215 is provided to close the opening 2122. As shown in FIGS. 3, 6 and the like, the opening duct 215 extends downward along the front corner column 212 and reaches an open end 2151. The open end 2151 is opened downward at a position below the opening 2122 to bring the inside of the opening duct 215 into communication with the transfer chamber T2. That is, the return path T3 formed by the hollow portion 2121 of each front corner column 212 communicates with the transfer chamber T2 via the opening 2122 and the opening duct 215.

Further, as shown in FIGS. 3, 7 and the like, each front corner column 212 is connected to a beam member 217 at the upper end portion thereof. A hollow portion is formed inside the beam member 217. The hollow portion 2121 of each front corner column 212 communicates with the hollow portion of the beam member 217. The hollow portion of the beam member 217 communicates with the unit installation chamber T1 via an opening 2142 (see FIG. 7) provided in the support plate 214. That is, the return path T3 formed by the hollow portion 2121 of each front corner column 212 communicates with the unit installation chamber T1 via the hollow portion of the beam member 217 and the opening 2142 of the support plate 214.

A first fan 43 is arranged in the return path T3. As shown in FIG. 3, the first fan 43 is arranged inside the opening duct 215 and is configured to suck a gas from the lower side and send the gas upward to form an air flow flowing upward through the return path T3. That is, when the first fan 43 is operated, the nitrogen gas in the transfer chamber T2 (i.e., the nitrogen gas flowing downward through the transfer chamber T2 and reaching the vicinity of the bottom of the transfer chamber T2) is sucked through the opening duct 215 and sent upward in the return path T3. The nitrogen gas flowing upward through the return path T3 flows into the unit installation chamber T1. That is, the nitrogen gas flowing downward in the transfer chamber T2 is returned to the unit installation chamber T1 through the return path T3. The nitrogen gas returned to the unit installation chamber T1 is cleaned by the filters 42 and 412, and then sent back to the transfer chamber T2.

(Individual Return Path T4)

The individual return path T4 is provided in each of the hollow portions 2131 of the two intermediate columns 213.

As shown in FIGS. 4 and 5, an opening 2132 communicating with the hollow portion 2313 is formed at a position near the lower end on the rear surface of each intermediate column 213. A closing duct 216 is formed to close the opening 2132. As shown in FIGS. 4, 5, 6 and the like, the closing duct 216 extends downward along the intermediate column 213 to reach the closed end 2161 which is closed with respect to the transfer chamber T2.

As shown in FIGS. 2 and 4, a connecting pipe 226 extending from the case 225 of the transfer device 22 is connected to the closing duct 216 provided in the intermediate column 213 arranged on the left side. Further, as shown in FIGS. 2 and 5, a connecting pipe 236 extending from the case 235 of the aligner 23 is connected to the closing duct 216 provided in the intermediate column 213 arranged on the right side. That is, the individual return path T4 formed by the hollow portion 2131 of each intermediate column 213 communicates with the cases 225 and 235 of the transfer device 22 and the aligner 23 arranged in the transfer chamber T2 via the opening 2132, the closing duct 216, and the connecting pipes 226 and 236.

Further, as shown in FIGS. 4, 5, 7, and the like, each intermediate column 213 is connected to a beam member 217 at the upper end portion thereof. A hollow portion is formed inside the beam member 217. The hollow portion 2131 of each intermediate column 213 communicates with the hollow portion of the beam member 217. Further, as described above, the hollow portion of the beam member 217 communicates with the unit installation chamber T1 via an opening 2142 (see FIG. 7) provided in the support plate 214. That is, the individual return path T4 formed by the hollow portion 2131 of each intermediate column 213 communicates with the unit installation chamber T1 via the hollow portion of the beam member 217 and the opening 2142 of the support plate 214.

A second fan 44 is arranged in the individual return path T4. As shown in FIGS. 4 and 5, the second fan 44 is arranged inside the closing duct 216. The second fan 44 sucks a gas from below and sends the gas upward to form an air flow flowing upward through the individual return path T4. That is, when the second fan 44 is operated, the nitrogen gas sent from the cases 225 and 235 of the transfer device 22 and the aligner 23 arranged in the transfer chamber T2 is sucked into the closing duct 216 via the connecting pipes 226 and 236 and is sent upward through the individual return path T4. The nitrogen gas flowing upward through the individual return path T4 flows into the unit installation chamber T1. That is, the nitrogen gas flowing inside each of the transfer device 22 and the aligner 23 is returned to the unit installation chamber T1 through the individual return path T4. The nitrogen gas returned to the unit installation chamber T1 is cleaned by the filters 42 and 412, and then sent back to the transfer chamber T2.

As described above, a circulation path including the unit installation chamber T1, the transfer chamber T2, the return path T3, and the individual return path T4 is formed inside the housing 21 of the EFEM100. In this circulation path, there are provided a gas supply part 45 configured to supply the nitrogen gas and a gas discharge part 46 configured to discharge the nitrogen gas from the circulation path.

As shown in FIG. 3, the gas supply part 45 includes a supply pipe 451 and a supply valve 452 provided at the supply pipe 451. One end of the supply pipe 451 is connected to the side wall of the unit installation chamber T1, and the other end thereof is connected to the nitrogen gas supply source. The supply valve 452 is configured to include, for example, a mass flow controller whose opening degree can be freely adjusted. In response to an instruction from the control part 3, the control valve 542 changes an amount of nitrogen gas flowing through the supply pipe 451 (i.e., a supply amount of nitrogen gas s).

The control part 3 monitors oxygen concentration, water concentration, etc. of the nitrogen gas circulating through the circulation path and controls the opening degree of the supply valve 452, etc. so that the above-mentioned concentrations are maintained at predetermined values or less. Specifically, for example, in a case where the oxygen concentration exceeds a predetermined value, the control part 3 controls the supply valve 452 to increase the flow rate of the nitrogen gas supplied to the circulation path and decrease the oxygen concentration.

As shown in FIG. 3, the gas discharge part 46 includes a discharge pipe 461 and a discharge valve 462 provided at the discharge pipe 461. One end of the discharge pipe 461 is connected to the vicinity of the lower end of the side wall of the transfer chamber T2, and the other end thereof is connected to an exhaust line. The discharge valve 462 is configured to include, for example, a mass flow controller whose opening degree can be freely regulated. In response to an instruction from the control part 3, the discharge valve 462 changes an amount of nitrogen gas flowing through the discharge pipe 461 (i.e., a discharge amount of nitrogen gas).

The control part 3 monitors a pressure in at least one predetermined position in the circulation path and controls the opening degree of the discharge valve 462, and the like such that the pressure at each position is maintained within a predetermined appropriate range. Specifically, for example, when the pressure value becomes larger than the appropriate range, the opening degree of the discharge valve 462 is increased, and when the pressure value becomes smaller than the appropriate range, the opening degree of the discharge valve 462 is reduced. In a state in which the control part 3 is performing appropriate control, the pressure in the transfer chamber T2 becomes slightly higher than the pressure in the external space of the housing 21. That is, the appropriate range of the pressure value of the transfer chamber T2 is set to a value slightly higher than the pressure value in the external space of the housing 21. As a result, while suppressing the leakage of the nitrogen gas from the transfer chamber T2 to the external space of the housing 21, it is possible to prevent the outside air from entering the transfer chamber T2 from the external space of the housing 21.

<3. Capture Part 5>

As described above, a circulation path including the unit installation chamber T1, the transfer chamber T2, the return path T3 and the individual return path T4 is formed in the internal space of the housing 21 of the EFEM 100. The nitrogen gas is sent from the unit installation chamber T1 to flow downward through the transfer chamber T2 and is returned back to the unit installation chamber T1 through the return path T3 such that circulation of the nitrogen gas is formed. In addition, the nitrogen gas flows inside the transfer device 22 and the aligner 23 arranged in the transfer chamber T2. The nitrogen gas is returned back to the unit installation chamber T1 through the individual return path T4.

In this circulation path, flow path cross-sectional areas of the return path T3 and the individual return path T4 are smaller than a flow path cross-sectional area of the opening 2141 that brings the unit installation chamber T1 and the transfer chamber T2 into communication with each other. Flow path resistances of the return path T3 and the individual return path T4 are larger than a flow path resistance of the opening 2141. Therefore, the flow rate of the nitrogen gas sent through the opening 2141 tends to be larger than the flow rate of the nitrogen gas returned from the return path T3 and the individual return path T4, and the pressure in the unit installation chamber T1 tends to decrease. In a case where the pressure in the unit installation chamber T1 becomes lower than the pressure in the external space of the housing 21, the outside air may enter the unit installation chamber T1 from the external space. However, in this EFEM100, the nitrogen gas is positively sent to the return path T3 or the individual return path T4 by the first fan 43 and the second fan 44, thereby suppressing a pressure drop in the unit installation chamber T1 and preventing the intrusion of the outside air.

Meanwhile, when the first fan 43 sends the nitrogen gas to the return path T3, the pressure in the return path T3 is increased, and a differential pressure is generated on both sides of the partition wall separating the return path T3 and the transfer chamber T2 (i.e., on the inside and outside of the front corner column 212) such that a pressure on the side of the return path T3 becomes higher than that on the side of the transfer chamber T2. Similarly, when the second fan 44 sends the nitrogen gas to the return path T3, the pressure in the individual return path T4 is increased, and a differential pressure is generated on both sides of the partition wall separating the individual return path T4 and the transfer chamber T2 (i.e., on the inside and outside of the intermediate column 213) such that a pressure on the side of the individual return path T4 becomes higher than that on the side of the transfer chamber T2.

When the differential pressure is generated on both sides of the partition wall separating the return path T3 and the transfer chamber T2 such that the pressure on the side of the return path T3 becomes higher than that on the side of the transfer chamber T2, there is a possibility that a slight gas leak may occur from the return path T3 to the transfer chamber T2 through a minute gap formed in the partition wall. In this regard, the gas flowing through the return path T3 may contain particles. That is, the downflow formed in the transfer chamber T2 also plays a role of pushing the particles floating in the transfer chamber T2 downward, and the nitrogen gas returned through the return path T3 may contain particles floating in the transfer chamber T2. In a case where the gas containing such particles leaks into the transfer chamber T2, cleanliness of the transfer chamber T2 may decrease.

Similarly, when the differential pressure is generated on both sides of the partition wall separating the individual return path T4 and the transfer chamber T2 such that the pressure on the side of the individual return path T4 becomes higher than that on the side of the transfer chamber T2, there is a possibility that a slight gas leak may occur from the individual return path T4 to the transfer chamber T2 through a minute gap formed in the partition wall. In this regard, the gas flowing through the individual return path T4 may also contain particles. That is, when the transfer device 22 or the aligner 23 is driven, the particles generated by the drive mechanisms 224 and 233 and the like and floating in the cases 225 and 235 are sent together with the nitrogen gas in the cases 225 and 235 via the connecting pipes 226 and 236 by the fans 227 and 237 and are allowed to flow into the individual return path T4 connected to the connecting pipes 226 and 236. Therefore, the gas flowing through the individual return path T4 may contain particles generated by the drive mechanisms 224 and 233 and the like of the transfer device 22 and the aligner 23. In a case where the gas containing such particles leaks into the transfer chamber T2, the cleanliness of the transfer chamber T2 may decrease.

Figure 8:
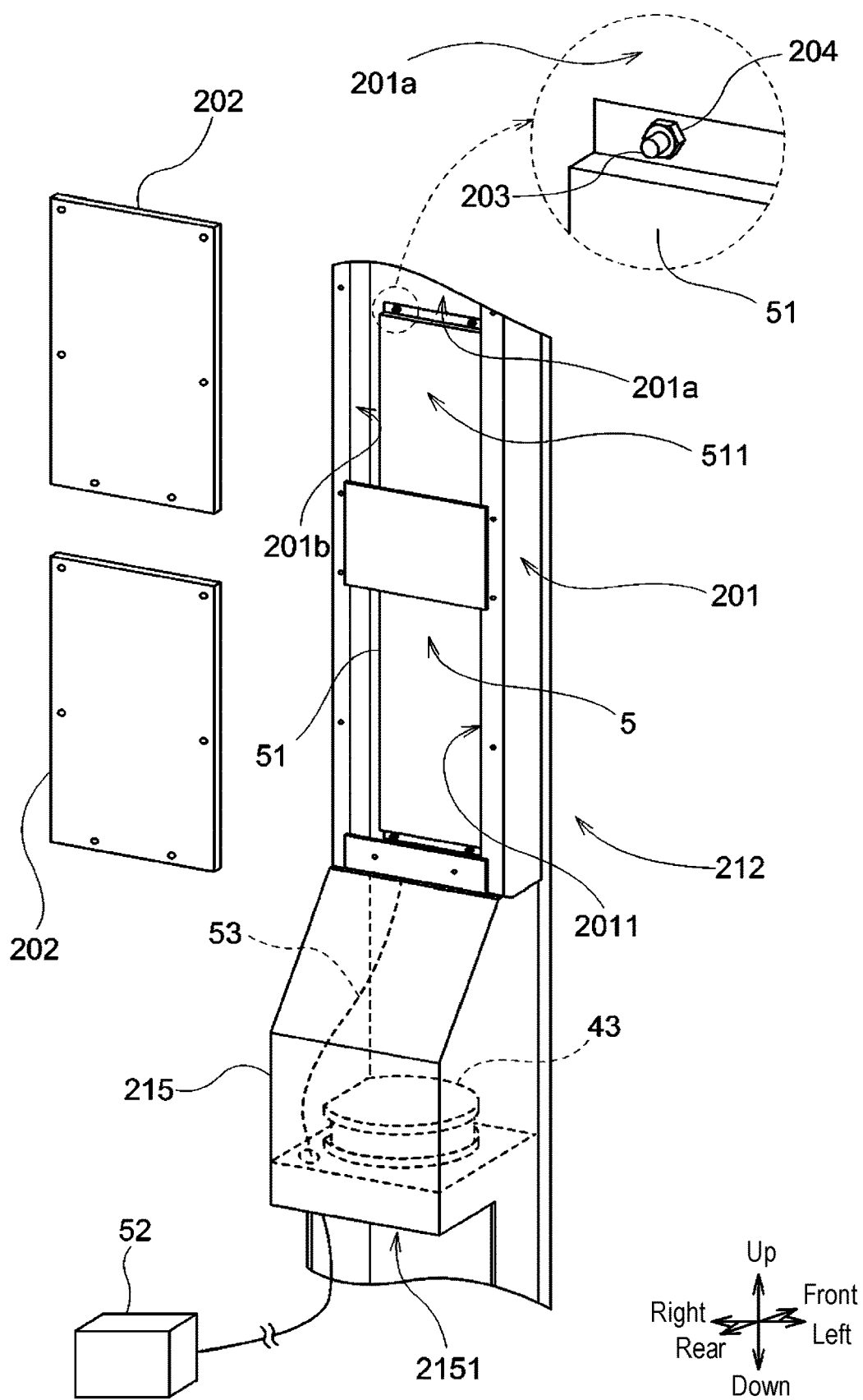
FIG. 8 is a view showing a corner column and a charging part installed thereon.

Therefore, in this EFEM100, a capture part 5 configured to capture particles is provided in each of the return path T3 and the individual return path T4. The capture part 5 will be described with reference to FIG. 8 in addition to FIGS. 6 and 7. FIG. 8 is a view showing a front corner column 212 and a charging part 51 provided therein.

The capture part 5 electrically captures the particles contained in the gas and includes a charging part 51, a voltage applying part 52 configured to apply a voltage to the charging part 51, and a conducting wire 53 that connects the charging part 51 and the voltage applying part 52.

The charging part 51 is a thin-walled member, and one main surface thereof constitutes a charging surface 511. When the voltage applying part 52 applies a predetermined voltage to the charging part 51 through the conducting wire 53, the charging surface 511 of the charging part 51 is charged. When the charging surface 511 is charged, the particles around the charging surface 511 are attracted by an electrostatic force and captured by the charging surface 511 as the particles adhere to (adsorb) to the charging surface 511.

As described above, each of the front corner columns 212 and the intermediate columns 213 has a cylindrical shape with a rectangular cross section, and the hollow portions 2121 and 2131 formed therein constitute the return path T3 and the individual return path T4. The charging part 51 is provided on the inner wall surface of each of the front corner columns 212 and the intermediate columns 213.

Now, the configurations of the respective columns (target columns) 212 and 213 to which the charging part 51 is attached will be specifically described. Each of the target columns 212 and 213 includes a main body portion 201 having a U-shaped cross section with an opening on the rear side thereof, and a cover portion 202 attached to the main body portion 201 to airtightly close the opening 2011 on the rear side of the main body portion 201. The cover portion 202 airtightly closes the opening 2011 to form the airtight hollow portions 2121 and 231. When the cover portion 202 is removed from the main body portion 201, the opening 2011 on the rear side of the main body portion 201 is exposed such that the inner wall surfaces (i.e., the front inner wall surface 201a and the left and right inner wall surfaces 201b) of the main body portion 201 are accessible.

The charging part 51 is provided on the inner wall surface which is accessible through the opening 2011 when the cover portion 202 is removed. Specifically, the charging part 51 is attached to the front inner wall surface 201a such that the charging surface 511 faces rearward. The charging part 51 may be attached to the inner wall surface 201a in any manner. For example, a plurality of stud bolts 203 may be erected on the inner wall surface 201a, the respective stud bolts 203 may be inserted through the respective through-holes provided in the charging part 51, and nuts 204 may be fastened to the stud bolts 203 from above such that the charging part 51 is attached to the inner wall surface 201a.

The conducting wire 53 extending from the charging part 51 is drawn out through the opening duct 215 (or the closing duct 216) together with the wiring extending from the first fan 43 (or the second fan 44) accommodated therein and is connected to the voltage applying part 52.

The charging part 51 is preferably shaped and sized to cover substantially the entire inner wall surface 201a to which the charging part 51 is attached. That is, it is preferable that a left-right width of the charging part 51 is substantially the same as a left-right width of the inner wall surface 201a, and a vertical dimension of the charging part 51 is substantially the same as a vertical dimension of the inner wall surface 201a. Alternatively, a plurality of charging parts 51 smaller than the inner wall surface 201a may be arranged to cover substantially the entire inner wall surface 201a.

When the voltage applying part 52 applies a predetermined voltage to the charging part 51 provided on the inner wall surface 201a of the target columns 212 and 213, the charging surface 511 is charged. Then, the particles around the charging surface 511, i.e., the particles contained in the nitrogen gas flowing through the return path T3 and the individual return path T4 configured by the hollow portions 2121 and 2131 of the target columns 212 and 213 are attracted by an electrostatic force and are adsorbed and captured on the charging surface 511. As a result, the particles contained in the nitrogen gas flowing through the return path T3 and the individual return path T4 are removed. Therefore, even in a case where the gas leaks from the return path T3 or the individual return path T4 toward the transfer chamber T2 having a lower pressure than the pressure in the return path T3 or the individual return path T4, the number of particles in the transfer chamber T2 is unlikely to increase. That is, the cleanliness of the transfer chamber T2 is unlikely to decrease.

The captured particles are accumulated on the charging surface 511. Therefore, it is preferable that at an appropriate timing such as the timing of maintenance of the EFEM 100, or the like, an operation is performed to stop the application of the voltage to the charging part 51 and to wipe off and collect the particles adhering to the charging surface 511 (wet cleaning). In this example, the charging part 51 is provided at a position which is accessible through the opening 2011 exposed by removing the cover portion 202. Therefore, the operator can collect the particles adhering to the charging surface 511 by removing the cover portion 202 and wiping the charging surface 511 appearing inside the opening 2011 with a cloth or the like.

<4. Effect>

The EFEM 100 according to the above-described embodiment is provided with a circulation path including the transfer chamber T2 configured to form the transfer space in which the wafer 9 is transferred and the return path T3 configured to return the gas flowing from one side to the other side of the transfer chamber T2. The return path T3 and the transfer chamber T2 are provided to interpose a partition wall therebetween and are configured to generate a differential pressure on both sides of the partition wall such that a pressure on the side of the return path T3 becomes higher than that on the side of the transfer chamber T2 in a state in which the gas circulates through the circulation path. The EFEM 100 includes the capture part 5 provided in the return path T3 and configured to electrically capture particles contained in the gas flowing therethrough.

According to this configuration, the particles contained in the gas flowing through the return path T3 are electrically captured. Therefore, even in a case where the gas leaks from the return path T3 toward the transfer chamber T2 having a lower pressure than the pressure in the return path T3, the number of particles in the transfer chamber T2 is unlikely to increase. Accordingly, it is possible to sufficiently suppress the adhesion of particles to the wafer 9 in the transfer chamber T2.

Further, when the particles contained in the gas flowing through the return path T3 are to be captured by, for example, a gas permeation type filter (physical particle filter), it is inevitable that the flow path resistance of the return path T3 will increase significantly, and it is inevitable that the size of the fan (first fan) 43 configured to send the gas to the return path T3 will increase. Since the capture part 5 provided in the return path T3 electrically captures the particles, the particles can be captured without significantly increasing the flow path resistance of the return path T3. Accordingly, it is possible to avoid increasing the size of the first fan 43.

Further, in the above configuration, since the capture part 5 is provided in the return path T3, the particles contained in the gas flowing through the circulation path are dispersed and captured by the filter 412 of the fan filter unit 41 and the capture part 5. Therefore, the number of particles accumulated in the filter 412 is smaller than that in the case where the capture part 5 is not provided. As a result, life of the fan filter unit 41 is extended, and replacement cycle thereof is lengthened.

Further, in the EFEM 100 according to the above-described embodiment, the capture part 5 is configured to capture the particles contained in the gas by causing the particles to adhere to a charging surface 511 by an electrostatic force.

According to this configuration, the particles contained in the gas flowing through the return path T3 can be sufficiently captured with a simple configuration, and the maintenance is easy to perform. For example, when capturing the particles with a filter, periodic filter replacement is required. However, in the case where the particles are to be captured by causing the particles to adhere to the charging surface 511, the particles can be collected by a relatively simple operation such as releasing the charging of the charging surface 511 and wiping the charging surface 511.

Further, the EFEM 100 according to the above-described embodiment includes the housing 21 including the plurality of panels 211 and the columns 212 and 213 configured to support the plurality of panels 211, wherein the columns 212 and 213 include a front corner column 212 with the hollow portion 2121 in which the return path T3 is provided, and the capture part 5 is provided on the inner wall surface 201a of the front corner column 212.

According to this configuration, the return path T3 is provided in the hollow portion 2121 of the front corner column 212. Therefore, the footprint of the apparatus can be suppressed to a small size. On the other hand, since the return path T3 is limited to the narrow space of the hollow portion 2121 of the front corner column 212, it is inevitable that the flow path resistance of the return path T3 becomes relatively large. Since the capture part 5 provided in the return path T3 electrically captures the particles, as described above, an increase in the width of the flow path resistance due to the provision of the capture part 5 is sufficiently small. Accordingly, it is possible to avoid increasing the size of the first fan 43.

Further, in the EFEM 100 according to the above-described embodiment, the front corner column 212 includes an opening 2011 through which the capture part 5 is accessible and a cover portion 202 by which the opening 2011 is closable and openable.

According to this configuration, by keeping the opening 2011 in an open state, the capture part 5 can be accessed through the opening 2011. Accordingly, the maintenance of the capture part 5 can be performed easily.

Further, in the EFEM 100 according to the above-described embodiment, the circulation path includes the individual return path T4 configured to return the gas flowing inside predetermined devices 22 and 23 arranged in the transfer chamber T2, the individual return path T4 and the transfer chamber T2 are provided with a partition wall interposed therebetween such that when the gas circulates through the circulation path, a differential pressure is generated on both sides of the partition wall with the pressure on the side of the individual return path T4 kept higher than that on the side of the transfer chamber T2, and the capture part 5 is provided in each of the return path T3 and the individual return path T4.

According to this configuration, the gas flowing inside the devices 22 and 23 arranged in the transfer chamber T2 is returned through the individual return paths T4. Therefore, it is possible to sufficiently suppress occurrence of the situation in which the particles generated inside the devices 22 and 23 are discharged to the transfer chamber T2 and adhere to the wafer 9 in the transfer chamber T2. Further, the particles contained in the gas flowing through the individual return path T4 are electrically captured. Therefore, even in the case where the gas leaks from the individual return path T4 toward the transfer chamber T2 having a lower pressure than the pressure in the individual return path T4, the number of particles in the transfer chamber T2 is unlikely to increase.

<5. Other Embodiment>

In the above-described embodiment, the connecting pipes 226 and 236 configured to guide the gas flowing inside the transfer device 22 and the aligner 23 are connected to the intermediate column 213. Alternatively, as in the EFEM 100a shown in FIG. 9, the connecting pipes 226 and 236 may be connected to an intermediate portion of the return path T3 at a position upstream of the capture part 5 (specifically, for example, a position between the open end 2151 of the opening duct 215 provided in the front corner column 212 and the first fan 43).

According to this configuration, the gas flowing inside the transfer device 22 and the aligner 23 is introduced into the return path T3 from the position upstream of the capture part 5 in the middle of the return path T3 and is returned through the return path T3. Therefore, it is possible to sufficiently suppress occurrence of the situation in which the particles generated inside the transfer device 22 and the aligner 23 are discharged to the transfer chamber T2 and adhere to the wafer 9 in the transfer chamber T2. Further, since the gas flowing inside the transfer device 22 and the aligner 23 is introduced into the return path T3 at a position upstream of the capture part 5, the particles contained in the mixed gas including the gas flowing through the transfer chamber T2 and the gas flowing through the transfer device 22 and the aligner 23 are captured by the capture part 5. Accordingly, the particles contained in both gases can be efficiently captured.

Figure 9:
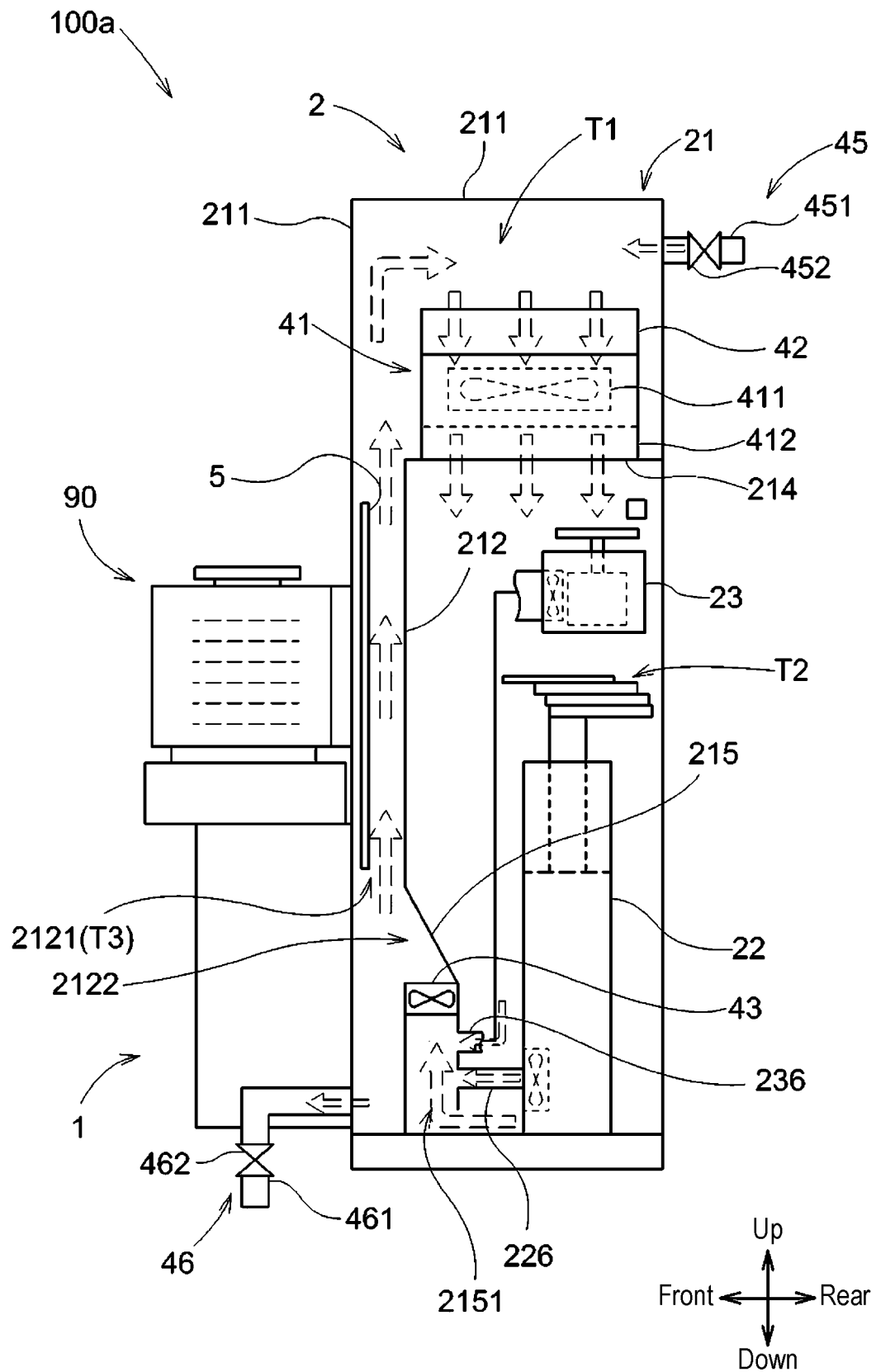
FIG. 9 is a side view schematically showing an EFEM according to a modification.

In the example of FIG. 9, both the connecting pipe 226 extending from the case 225 of the transfer device 22 and the connecting pipe 236 extending from the case 235 of the aligner 23 are connected to the same front corner column 212. Alternatively, the connecting pipe 226 on the side of the transfer device 22 may be connected to, for example, the left front corner column 212, and the connecting pipe 236 on the side of the aligner 23 may be connected to, for example, the right front corner column 212.

In the above-described embodiment, the return path T3 is configured by the hollow portion 2121 of each front corner column 212. However, the configuration of the return path T3 is not limited thereto. Further, although the individual return path T4 is configured by the hollow portion 2131 of each intermediate column 213, the configuration of the individual return path T4 is not limited thereto.

For example, the hollow portion 2121 of the corner column 212 arranged on the rear side or the hollow portion 2131 of the intermediate column 213 may constitute the return path T3. Alternatively, the hollow portion 2121 of the corner column 212 may constitute the individual return path T4.

Further, for example, in the vicinity of the panel 211 constituting the peripheral wall (front wall, rear wall, left wall, or right wall) of the housing 21, a partition panel extending parallel to the panel 211 may be provided while having a gap between the panel 211 and the partition panel.

The return path T3 or (and) the individual return path T4 may be configured by the space between the panel 211 and the partition panel.

In the above-described embodiment, in the state in which the gas circulates through the circulation path, the differential pressures are generated on both sides of the partition wall separating the return path T3 (or the individual return path T4) and the transfer chamber T2 such that the pressure on the side of the return path T3 (or the individual return path T4) is higher than that on the side of the transfer chamber T2. The pressure difference is preferably 10 Pa or more and 100 Pa or less, more preferably 30 Pa or more and 50 Pa or less. That is, the present disclosure functions particularly effectively when such a pressure difference is generated between the return path T3 (or the individual return path T4) and the transfer chamber T2.

In the above-described embodiment, the individual return path T4 is not an essential configuration and may be omitted. For example, the connecting pipes 226 and 236 extending from the cases 225 and 235 of the transfer device 22 or (and) the aligner 23 may be connected to the exhaust line such that the gas in the cases 225 and 235 is exhausted without being circulated. When the individual return path T4 is not provided, the hollow portion 2131 of the intermediate column 213 may constitute the return path T3.

In the above-described embodiment, the capture part 5 is configured to capture the particles contained in the gas by allowing the particles to adhere to the charging surface 511 by an electrostatic force. However, the configuration of the capture part 5 is not limited thereto. That is, the capture part 5 may have any configuration as long as it can electrically capture the particles contained in the gas. For example, the particles may be electrically collected by arranging an electrode in the middle of the gas flow path and forming an electromagnetic field with the electrode. Alternatively, the particles contained in the gas may be electrically captured by generating plasma.

In the above-described embodiment, any configuration may be used to charge the charging part 51 of the capture part 5. For example, by bringing a terminal serving as a charge supply source into contact with the charging part, electric charges may be supplied to and accumulated in the charging part. Alternatively, the charging part may be charged by a corona discharge method.

In the above embodiment, the first fan 43 and the second fan 44 are not essential configurations, and one or both of them may be omitted.

In the above-described embodiment, the supply pipe 451 of the gas supply part 45 is connected to the unit installation chamber T1 and the nitrogen gas is supplied to the unit installation chamber T1. However, a supply position of the nitrogen gas is limited thereto. The nitrogen gas may be supplied from an arbitrary position in the circulation path. For example, the supply pipe 451 of the gas supply part 45 may be connected to the return path T3 to supply the nitrogen gas to the return path T3. When the nitrogen gas is supplied to the return path T3, the pressure in the return path T3 is increased by the supply of the nitrogen gas. Therefore, even in a case where the first fan 43 is not provided, there is a possibility that, in the state in which the nitrogen gas circulates through the circulation path, the differential pressure is generated on both sides of the partition wall separating the return path T3 and the transfer chamber T2 (i.e., the inside and outside of the front corner column 212) such that the pressure on the side of the return path T3 becomes higher than that on the side of the transfer chamber T2. Furthermore, there is a possibility that the gas leaks from the return path T3 to the transfer chamber T2. However, by providing the capture part 5 in the return path T3 as described above, even in a case where such a gas leak occurs, the number of particles in the transfer chamber T2 is unlikely to increase. That is, the cleanliness of the transfer chamber T2 is unlikely to decrease.

In the above-described embodiment, the discharge pipe 461 of the gas discharge part 46 is connected to the transfer chamber T2, and the nitrogen gas is discharged from the transfer chamber T2. However, a discharge position of nitrogen gas is not limited thereto. The nitrogen gas may be discharged from any position in the circulation path.

In the above-described embodiment, when the hand 221 grips the wafer 9 by a so-called mechanical clamp method in which the clamp member is driven by the drive mechanism to hold and release the wafer 9, it may be possible to adopt a configuration in which the particles generated when the clamp member is driven are sucked and introduced into the connecting pipe 226.

In the above-described embodiment, the filter configured to capture particles may be provided in the vicinity of the fan 227 provided in the case 225 of the transfer device 22. Similarly, a filter configured to capture particles may be provided in the vicinity of the fan 237 provided in the case 235 of the aligner 23.

In the above-described embodiment, the gas circulating through the circulation path is the nitrogen gas. However, the circulating gas is not limited to the nitrogen gas and may be other gases (e.g., various inert gases such as an argon gas and the like, a dry air, etc.).

In the above-described embodiment, an object to be transferred is not limited to the wafer 9 but may be a glass substrate or the like.

In the above-described embodiment, there is exemplified the case where the present disclosure is applied to the EFEM 100. However, a target to which the present disclosure is applied is not limited to the EFEM 100. For example, the present disclosure may be applied to various devices that internally form a transfer space configured to transfer an object which requires a clean environment. Specifically, for example, the present disclosure may be applied to a sorter apparatus configured to replace or rearrange an object stored in a storage container (e.g., the wafer 9 stored in the storage container 90). Further, for example, the present disclosure may be applied to a substrate processing apparatus including a plurality of processing units that form a substrate transfer space therebetween. In addition, the present disclosure may be applied to an apparatus (e.g., a stocker apparatus) in which a storage space configured to store an object requiring a clean environment is formed, an apparatus (e.g., various substrate processing apparatuses) in which a processing space configured to process an object requiring a clean environment is formed, and so forth.

Other configurations may also be variously modified without departing from the spirit of the present disclosure.

According to the present disclosure in some embodiments, it is possible to reduce particle contamination of a substrate in a gas circulation type EFEM.

While certain embodiments have been described, these embodiments have been presented by way of example only and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An EFEM including a circulation path including a transfer chamber configured to form a transfer space where a substrate is transferred and a return path configured to return a gas flowing from one side to the other side of the transfer chamber, the EFEM comprising:
a capture part provided in the return path and configured to electrically capture particles contained in the gas flowing through the return path,
wherein the return path and the transfer chamber are provided such that a partition wall is interposed therebetween, and a differential pressure is generated on both sides of the partition wall such that a pressure on the side of the return path becomes higher than a pressure on the side of the transfer chamber in a state in which the gas circulates through the circulation path.

2. The EFEM of claim 1, wherein the capture part is configured to capture the particles contained in the gas by causing the particles to adhere to a charging surface by an electrostatic force.

3. The EFEM of claim 1, further comprising
a housing including a plurality of panels and a column configured to support the plurality of panels,
wherein the column includes a hollow portion,
wherein the return path is provided in the hollow portion, and
wherein the capture part is provided on an inner wall surface of the column.

4. The EFEM of claim 2, further comprising
a housing including a plurality of panels and a column configured to support the plurality of panels,
wherein the column includes a hollow portion,
wherein the return path is provided in the hollow portion, and
wherein the capture part is provided on an inner wall surface of the column.

5. The EFEM of claim 3, wherein the column includes:
an opening through which the capture part is accessible; and
a cover portion configured to be capable of closing and opening the opening.

6. The EFEM of claim 4, wherein the column includes:
an opening through which the capture part is accessible; and
a cover portion configured to be capable of closing and opening the opening.

7. The EFEM of claim 1, wherein the circulation path includes an individual return path configured to return gas flowing inside a predetermined device arranged in the transfer chamber,
wherein the individual return path and the transfer chamber are provided such that a partition wall is interposed therebetween such that when the gas circulates through the circulation path, a differential pressure is generated on both sides of the partition wall such that a pressure on the side of the individual return path is kept higher than the pressure on the side of the transfer chamber, and
wherein the capture part is provided in each of the return path and the individual return path.

8. The EFEM of claim 2, wherein the circulation path includes an individual return path configured to return gas flowing inside a predetermined device arranged in the transfer chamber,
wherein the individual return path and the transfer chamber are provided such that a partition wall is interposed therebetween such that when the gas circulates through the circulation path, a differential pressure is generated on both sides of the partition wall such that a pressure on the side of the individual return path is kept higher than the pressure on the side of the transfer chamber, and
wherein the capture part is provided in each of the return path and the individual return path.

9. The EFEM of claim 3, wherein the circulation path includes an individual return path configured to return gas flowing inside a predetermined device arranged in the transfer chamber,
wherein the individual return path and the transfer chamber are provided such that a partition wall is interposed therebetween such that when the gas circulates through the circulation path, a differential pressure is generated on both sides of the partition wall such that a pressure on the side of the individual return path is kept higher than the pressure on the side of the transfer chamber, and
wherein the capture part is provided in each of the return path and the individual return path.

10. The EFEM of claim 4, wherein the circulation path includes an individual return path configured to return gas flowing inside a predetermined device arranged in the transfer chamber,
wherein the individual return path and the transfer chamber are provided such that a partition wall is interposed therebetween such that when the gas circulates through the circulation path, a differential pressure is generated on both sides of the partition wall such that a pressure on the side of the individual return path is kept higher than the pressure on the side of the transfer chamber, and
wherein the capture part is provided in each of the return path and the individual return path.

11. The EFEM of claim 5, wherein the circulation path includes an individual return path configured to return gas flowing inside a predetermined device arranged in the transfer chamber,
wherein the individual return path and the transfer chamber are provided such that a partition wall is interposed therebetween such that when the gas circulates through the circulation path, a differential pressure is generated on both sides of the partition wall such that a pressure on the side of the individual return path is kept higher than the pressure on the side of the transfer chamber, and
wherein the capture part is provided in each of the return path and the individual return path.

12. The EFEM of claim 6, wherein the circulation path includes an individual return path configured to return gas flowing inside a predetermined device arranged in the transfer chamber,
wherein the individual return path and the transfer chamber are provided such that a partition wall is interposed therebetween such that when the gas circulates through the circulation path, a differential pressure is generated on both sides of the partition wall such that a pressure on the side of the individual return path is kept higher than the pressure on the side of the transfer chamber, and
wherein the capture part is provided in each of the return path and the individual return path.

13. The EFEM of claim 1, wherein a connecting pipe configured to guide gas flowing inside a predetermined device arranged in the transfer chamber is connected to an intermediate portion of the return path at an upstream side of the capture part.

14. The EFEM of claim 2, wherein a connecting pipe configured to guide gas flowing inside a predetermined device arranged in the transfer chamber is connected to an intermediate portion of the return path at an upstream side of the capture part.

15. The EFEM of claim 3, wherein a connecting pipe configured to guide gas flowing inside a predetermined device arranged in the transfer chamber is connected to an intermediate portion of the return path at an upstream side of the capture part.

16. The EFEM of claim 4, wherein a connecting pipe configured to guide gas flowing inside a predetermined device arranged in the transfer chamber is connected to an intermediate portion of the return path at an upstream side of the capture part.

17. The EFEM of claim 5, wherein a connecting pipe configured to guide gas flowing inside a predetermined device arranged in the transfer chamber is connected to an intermediate portion of the return path at an upstream side of the capture part.

18. The EFEM of claim 6, wherein a connecting pipe configured to guide gas flowing inside a predetermined device arranged in the transfer chamber is connected to an intermediate portion of the return path at an upstream side of the capture part.

* * * * *